United States Patent
Brugger et al.

(10) Patent No.: US 10,037,887 B2
(45) Date of Patent: Jul. 31, 2018

(54) METHOD FOR IMPLANTING IONS INTO A SEMICONDUCTOR SUBSTRATE AND AN IMPLANTATION SYSTEM

(71) Applicant: Infineon Technologies AG, Neubiberg (DE)

(72) Inventors: Michael Brugger, Lieserbruecke (AT); Moriz Jelinek, Villach (AT); Johannes Georg Laven, Taufkirchen (DE); Hans-Joachim Schulze, Taufkirchen (DE); Werner Schustereder, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/435,034

(22) Filed: Feb. 16, 2017

(65) Prior Publication Data

US 2017/0243747 A1    Aug. 24, 2017

(30) Foreign Application Priority Data

Feb. 18, 2016    (DE) .................... 10 2016 102 865

(51) Int. Cl.
 H01L 21/66        (2006.01)
 H01L 21/265      (2006.01)
(52) U.S. Cl.
 CPC ........ *H01L 21/26586* (2013.01); *H01L 22/12* (2013.01); *H01L 22/20* (2013.01)
(58) Field of Classification Search
 None
 See application file for complete search history.

(56) References Cited

U.S. PATENT DOCUMENTS 6,255,662 B1    7/2001    Rubin et al.
6,940,079 B2    9/2005    Ray
(Continued)

FOREIGN PATENT DOCUMENTS

WO    2005071716 A2    8/2005

OTHER PUBLICATIONS

PVA TEPLA, "Twin-SC4, Thermal Wave Inspection System, User Manual," Oct. 31, 2016, 107 pages.
VIISTa, "VIISTa 900 D Specification," 4 pages.

*Primary Examiner* — Jack Chen
(74) *Attorney, Agent, or Firm* — Slater Matsil, LLP

(57) ABSTRACT

A method for implanting ions into a semiconductor substrate includes performing a test implantation of ions into a semiconductor substrate. The ions of the test implantation are implanted with a first implantation angle range over the semiconductor substrate. Further, the method includes determining an implantation angle offset based on the semiconductor substrate after the test implantation and adjusting a tilt angle of the semiconductor substrate with respect to an implantation direction based on the determined implantation angle offset. Additionally, the method includes performing at least one target implantation of ions into the semiconductor substrate after the adjustment of the tilt angle. The ions of the at least one target implantation are implanted with a second implantation angle range over the semiconductor substrate. Further, the first implantation angle range is larger than the second implantation angle range.

16 Claims, 7 Drawing Sheets

(56) References Cited

U.S. PATENT DOCUMENTS

2003/0224541 A1 12/2003 Huang et al.
2014/0175593 A1 6/2014 Schulze et al.
2017/0243747 A1* 8/2017 Brugger ............ H01L 21/26586

* cited by examiner

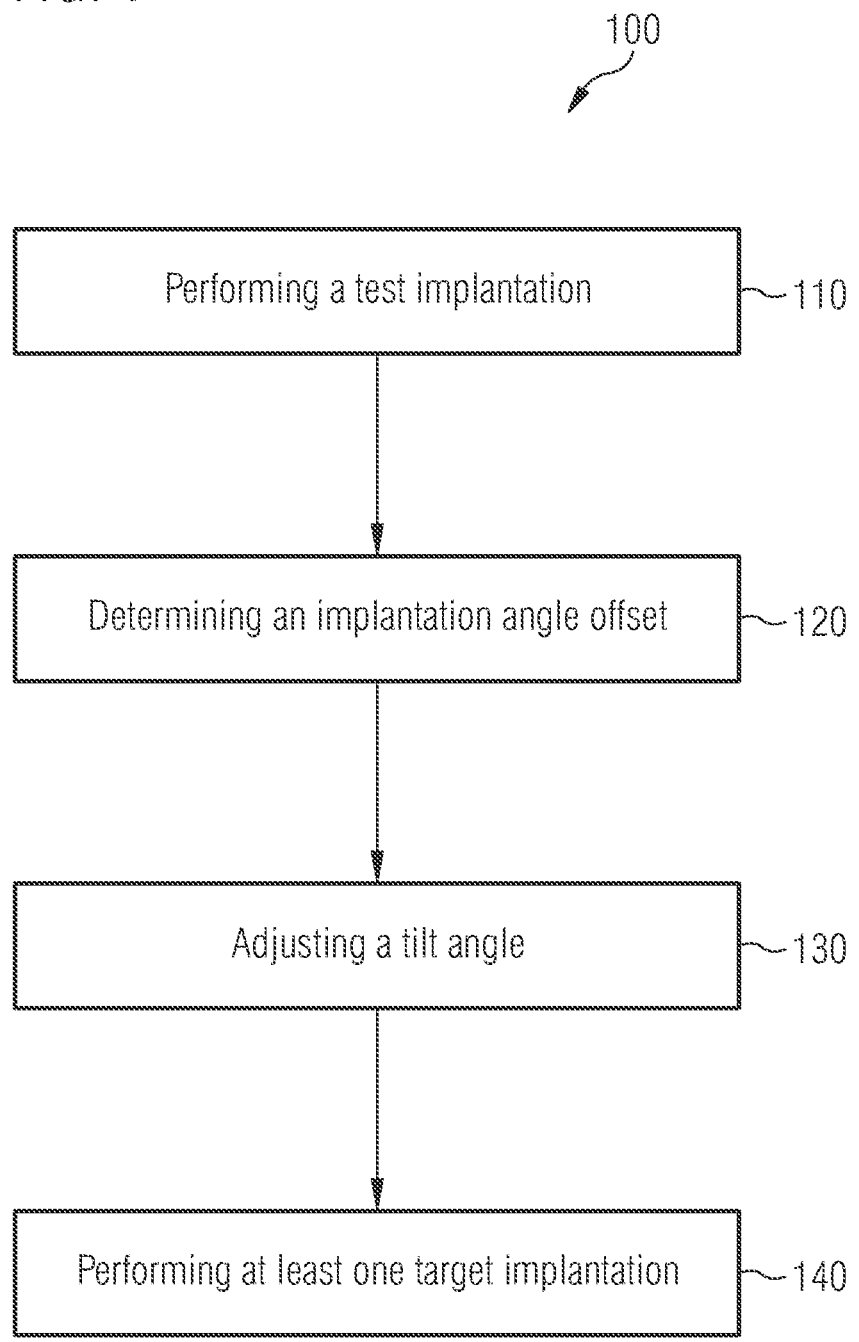

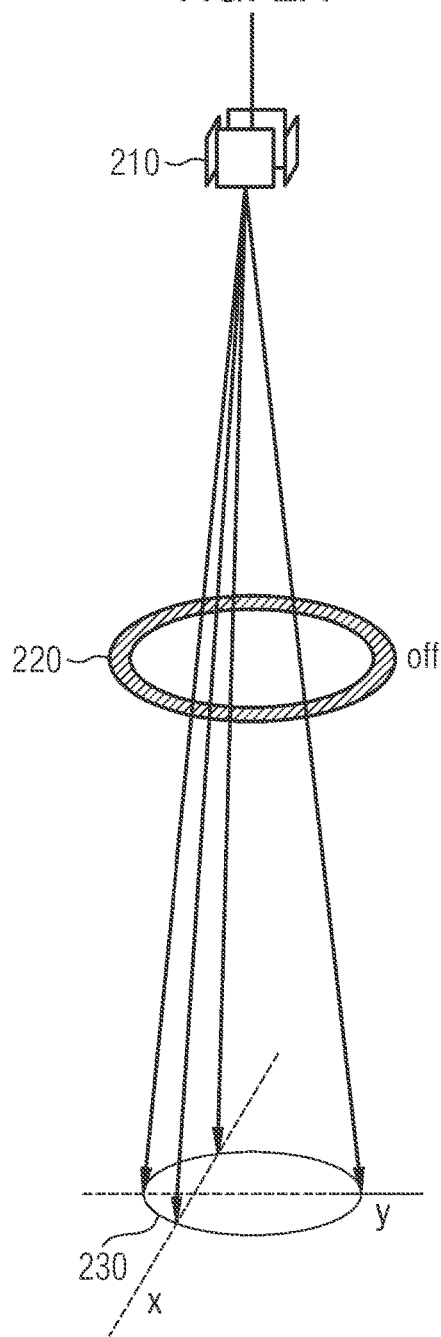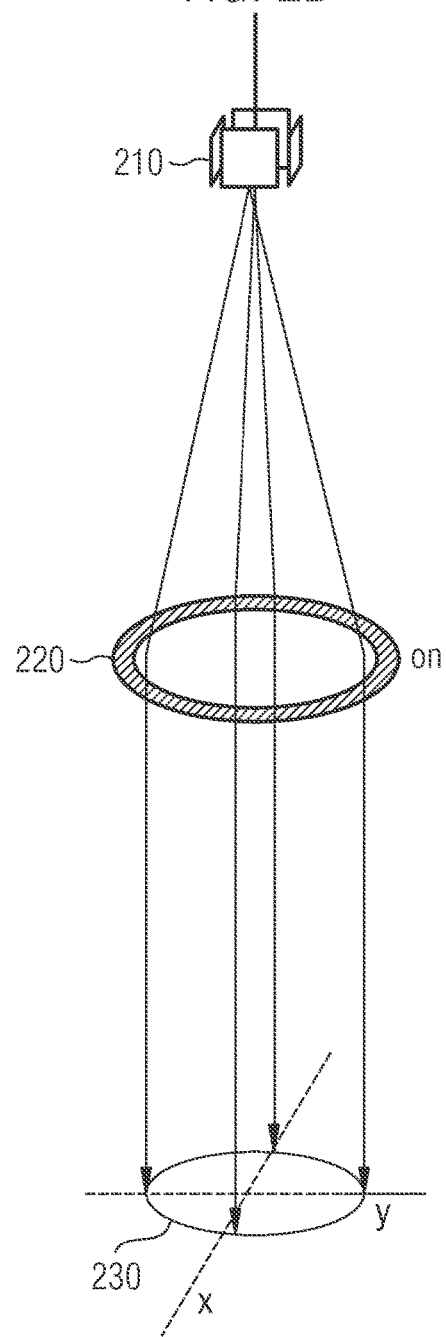

METHOD FOR IMPLANTING IONS INTO A SEMICONDUCTOR SUBSTRATE AND AN IMPLANTATION SYSTEM

CROSS-REFERENCE TO RELATED APPLICATIONS

This application claims the benefit of German Patent Application No. 102016102865.7, filed on Feb. 18, 2016, which application is hereby incorporated herein by reference.

TECHNICAL FIELD

Embodiments relate to concepts for ion implantation and in particular to a method for implanting ions into a semiconductor substrate and an implantation system.

BACKGROUND

Some semiconductor devices may require or may be improved by using deep channeling implantations. However, it is difficult to reliably implement the requirements in the production due to difficult or non-reproducibility. As shown in FIG. 7, at least three influencing variables may have an adverse impact on the wanted channeling effect at 0° implant, which are the accuracy of orientation of the platen 710 on which the wafer sits, the ion beam divergence 720, and the wafer cut angle 730 (additionally the angle offset between wafer and carrier in case of carrier-supported wafers), for example.

SUMMARY

There may be a demand for providing a concept for implanting ions, which allows to improve the reproducibility and/or accuracy and/or reliability of implantations.

Such a demand may be satisfied by the subject matter of the claims.

Some embodiments relate a method for implanting ions into a semiconductor substrate. The method comprises performing a test implantation of ions into a semiconductor substrate. The ions of the test implantation are implanted with a first implantation angle range over the semiconductor substrate. Further, the method comprises determining an implantation angle offset based on the semiconductor substrate after the test implantation and adjusting a tilt angle of the semiconductor substrate with respect to an implantation direction based on the determined implantation angle offset. Additionally, the method comprises performing at least one target implantation of ions into the semiconductor substrate after the adjustment of the tilt angle. The ions of the at least one target implantation are implanted with a second implantation angle range over the semiconductor substrate. Further, the first implantation angle range is larger than the second implantation angle range.

Some further embodiments relate to an implantation system comprising a first ion implantation module configured to perform a test implantation of ions into a semiconductor substrate and a measurement module configured to determine channeling information indicating a position at the semiconductor substrate at which channeling conditions occurred during the test implantation. Further, the implantation system comprises a processing module configured to determine an implantation angle offset based on the channeling information. The first or a second ion implantation module is configured to adjust a tilt angle of the semiconductor substrate with respect to an implantation direction based on the determined implantation angle offset. Further, the first or second ion implantation module is configured to perform at least one target implantation of ions into the semiconductor substrate after the adjustment of the tilt angle.

BRIEF DESCRIPTION OF THE DRAWINGS

Some embodiments of apparatuses and/or methods will be described in the following by way of example only, and with reference to the accompanying figures, in which FIG. 1 shows a flow chart of a method for implanting ions into a semiconductor substrate;

FIG. 2a shows a schematic illustration of an ion implantation with deactivated angle correction;

FIG. 2b shows a schematic illustration of an ion implantation with activated angle correction;

DETAILED DESCRIPTION OF ILLUSTRATIVE EMBODIMENTS

Figure 3:
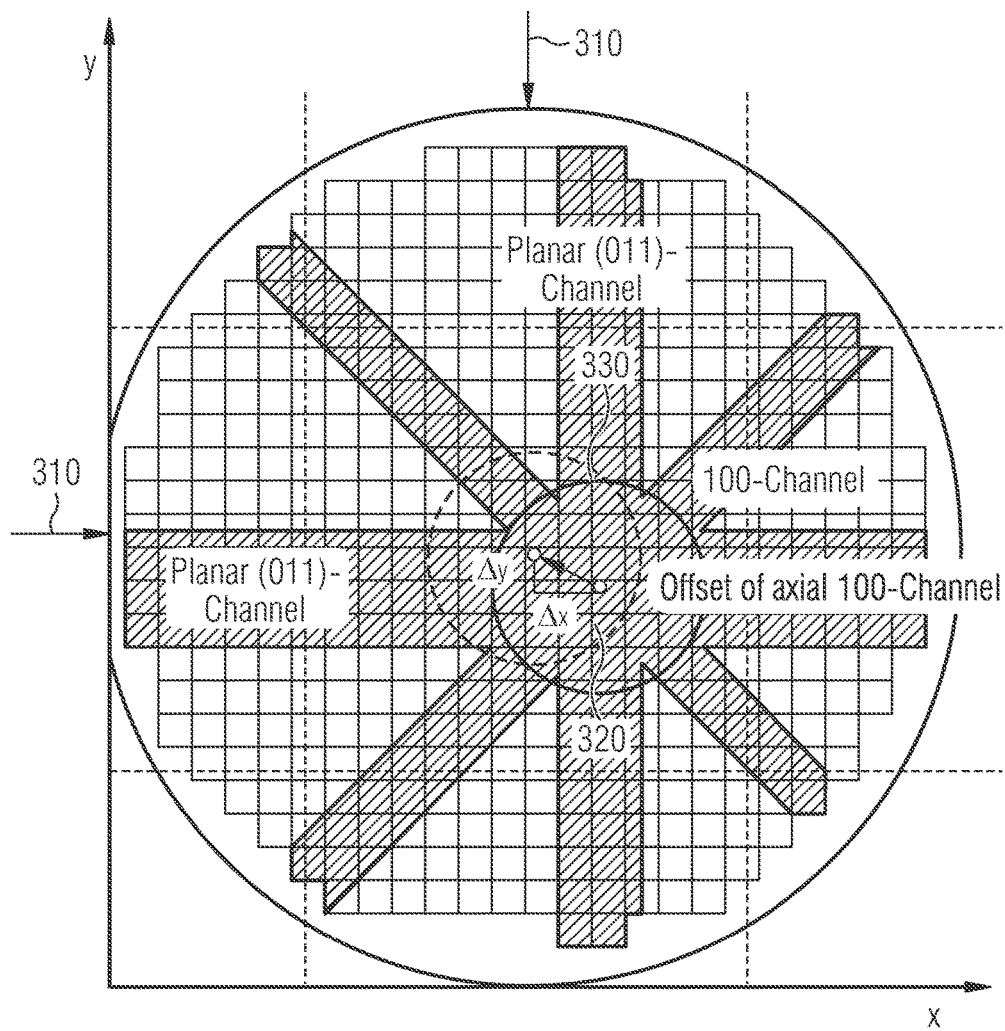
FIG. 3 shows a crystal defect or charge carrier density distribution over a semiconductor wafer.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

FIG. 1 shows a flow chart of a method for implanting ions into a semiconductor substrate according to an embodiment. The method 100 comprises performing a test implantation 110 of ions into a semiconductor substrate. The ions of the test implantation 110 are implanted with a first implantation angle range over the semiconductor substrate. Further, the method comprises determining 120 an implantation angle offset based on the semiconductor substrate after the test implantation and adjusting 130 a tilt angle of the semiconductor substrate with respect to an implantation direction based on the determined implantation angle offset. Additionally, the method 100 comprises performing at least one target implantation 140 of ions into the semiconductor substrate after the adjustment of the tilt angle. The ions of the at least one target implantation 140 are implanted with a second implantation angle range over the semiconductor substrate. Further, the first implantation angle range is larger than the second implantation angle range.

By performing a test implantation and adjusting the tilt angle of the semiconductor substrate, the angle accuracy for the target implantation may be significantly improved. In this way, the reproducibility and/or accuracy and/or reliability of implantation may be improved.

The test implantation 110 may be performed solely to provide a basis for the determination 120 of the implantation angle offset or may be additionally used to form one or more doping regions within the semiconductor substrate for manufacturing semiconductor devices. The test implantation may be done with a significantly lower implantation dose (e.g. less than 50%, less than 10% or less than 1%) than an implantation dose of the at least one target implantation 140. For example, the test implantation may be performed with an implantation dose of less than $3*10^{12}$ cm$^{-2}$ (or of less than $1*10^{12}$ cm$^{-2}$ or of less than $5*10^{11}$ cm$^{-2}$), if the test implantation 110 is performed solely to provide a basis for the determination 120 of the implantation angle offset. For example, the test implantation may be done at an implantation energy of more than 50 keV (or more than 100 keV, more than 500 keV, more than 1 MeV, more than 2 MeV or more than 3 MeV). For example, the test implantation may be done with an implantation energy equal to an implantation energy of the at least one target implantation 140. Alternatively, the test implantation may be done with an implantation energy higher than an implantation energy of the at least one target implantation 140 (e.g. more than twice or more than 10 times the implantation energy of the target implantation), if the test implantation 110 is performed solely to provide a basis for the determination 120 of the implantation angle offset.

The at least one target implantation 140 is used to incorporate or increase a base doping of the semiconductor substrate or to form one or more doping regions (e.g. one or more anode regions, one or more cathode regions, one or more source regions, one or more body regions, a drift region, a field stop region or a back side emitter region) within the semiconductor substrate for manufacturing semiconductor devices. The target implantation 140 may be performed at an implantation energy of more than 50 keV (or more than 100 keV, more than 500 keV, more than 1 MeV, more than 2 MeV or more than 3 MeV) and/or an implantation dose of more than $1*10^{13}$ cm$^{-2}$ (or of more than $1*10^{14}$ cm$^{-2}$ or of more than $1*10^{15}$ cm$^{-2}$).

Various types of ions may be used for the test implantation 110 and/or the target implantation 140. For example, ions causing donors or acceptors within a semiconductor substrate may be used. For example, ions of a first conductivity type may be used causing donors to form n-doped regions (e.g. protons, nitrogen N ions, phosphorus P ions, arsenic As ions or antimony Sb ions) or ions of a second conductivity type may be used causing acceptors to form p-doped regions (e.g. aluminum Al ions, boron B ions or gallium Ga ions). For example, the ions of the test implantation may be protons. The test implantation 110 and the at least one target implantation 140 may be performed by the same ion implantation module (e.g. using an ion beam generated by the same ion source) or by different ion implantation modules (e.g. implemented in two different implant devices). For example, the same ion implantation module may switch between different types of ions to be implanted during the test implantation and the at least one target implantation.

The test implantation 110 and the at least one target implantation 140 are performed with different implantation angle ranges over the semiconductor substrate. The implantation angle range over a semiconductor substrate may be defined as the difference between a maximal implantation angle at a first position on the semiconductor substrate and a minimal implantation angle at a different, second position on the semiconductor substrate. The implantation angle may be the angle between an orthogonal direction with respect to a surface of the semiconductor substrate and an implant direction of ions hitting the surface of the semiconductor substrate. The implantation angle may be different for different positions at the surface of the semiconductor substrate due to a beam divergence and/or a variation of the tilt angle of the semiconductor substrate during moving through the ion beam of the implantation. For example, the minimal implantation angle may be 0° (e.g. at one or more positions on the semiconductor substrate) for a substantially orthogonal implantation or between 0° and 60° for a tilted implantation. The maximal implantation angle of the test implantation may differ by more than 0.8° (or less than 1°, more than 20 or more than 5°) from the minimal implantation angle so that the first implantation angle range may be larger than 0.8° (or larger than 1°, larger than 2° or larger than 5°). The maximal implantation angle of the at least one target implantation may differ by less than 0.5° (or less than 0.3° or less than 0.1°) from the minimal implantation angle so that the second implantation angle range is lower than 0.5° (or lower than 0.3° or lower than 0.1°). The ion beam of the at least one target implantation may comprise a low beam divergence (e.g. lower than 0.3° or lower than 0.1°) to provide a laterally very homogenous implantation.

A target implantation with exactly a desired implantation angle may be usually difficult to be implemented due to an unknown exact tilt of the semiconductor substrate with respect to the ion beam. The test implantation 110 at the semiconductor substrate can generate an implantation angle dependent variation of a physical quantity over the semiconductor substrate. Based on a space resolved measurement of the varying physical quantity over the semiconductor substrate, an information on an offset of an implantation angle (implantation angle offset) of a target implantation 140 without tilt angle adjustment and the desired implantation angle of the at least one target implantation 140 may be derivable. In other words, an implantation angle offset can be determined 120 based on (a space resolved measurement of a physical quantity at) the semiconductor substrate after the test implantation 110. For example, the physical quantity may be a crystal defect density or a charge carrier density. For example, determining 120 the implantation angle offset may comprise measuring a crystal defect or charge carrier density of at least a plurality of laterally different positions of the semiconductor substrate to obtain a lateral crystal defect density distribution or a lateral charge carrier density distribution. In other words, a space resolved measurement of the crystal defect density or charge carrier density over the semiconductor substrate may be performed to obtain a map of the crystal defect density or charge carrier density over the semiconductor substrate.

For example, a desired implantation angle may be an angle enabling implantation of ions under channeling conditions. In semiconductor substrates particular crystallographic directions offer much lower stopping than other directions. Therefore, the implantation depth of an ion can be much deeper if the ion travels exactly along a particular direction, for example, the [110] direction in silicon. For example, this effect is called ion channeling and small variations from perfect orientation result in extreme differences in implantation depth.

For example, determining 120 the implantation angle offset may comprise determining a position at the semiconductor substrate at which channeling conditions occurred during the test implantation. The determination 120 of the implantation angle offset may be done in various ways. For example, the determination 120 of the implantation angle offset may be done based on a measured lateral crystal defect density distribution or lateral charge carrier density distribution. The crystal defect density or the charge carrier density may be measured by a laser-based measurement method, a Rutherford Backscattering Spectrometry (RBS) method or another method sensitive to the crystal defect density or density of free charge carriers. For example, a photo thermal measuring method may be used to determine the lateral crystal defect density distribution or a lateral charge carrier density distribution.

For example, the method may further comprise generating a Rutherford Backscattering Spectrometry signal (e.g. by a Rutherford Backscattering Spectrometry detection module) and calculating a crystal defect density distribution based on a correlation between the Rutherford Backscattering Spectrometry signal and information on a current scan position or scan angle (e.g. by a processing module).

The tilt angle of the semiconductor substrate with respect to an implantation direction of the at least one target implantation 140 can be adjusted 130 based on the determined implantation angle offset to enable the at least one target implantation 140 at a desired implantation angle. The tilt angle may be an angle between a direction orthogonal to the surface of the semiconductor substrate and the implantation direction (e.g. ion beam direction) of the at least one target implantation 140. For example, the tilt angle may be adjusted by changing a tilt of the semiconductor substrate and/or by changing the beam direction (e.g. change setting of beam control). By adjusting the tilt angle, the at least one target implantation 140 may be performed very accurately at the desired implantation angle. For example, the tilt angle may be adjusted so that channeling conditions are obtained for the at least one target implantation 140.

Optionally, a twist angle (or twist angle offset or rotation of the tilt axis) of the semiconductor substrate may be determined based on the semiconductor substrate after the test implantation. For example, the twist angle of the semiconductor substrate may be determined based a position at the semiconductor substrate at which channeling conditions occurred during the test implantation. The determination of the twist angle of the semiconductor substrate may be done in various ways. For example, the determination of the twist angle of the semiconductor substrate may be done based on a measured lateral crystal defect density distribution or lateral charge carrier density distribution. For example, the twist angle may be an angle between a crystal direction (e.g. identified based on the semiconductor substrate after the test implantation, for example, crystal defect or charge carrier density distribution) and a reference direction (e.g. from center of a wafer to a notch of the wafer) extending in parallel to a surface of the semiconductor substrate.

The twist angle (or a twist angle offset or rotation of the tilt axis) of the semiconductor substrate may be adjusted for the target implantation 140 based on the determined twist angle. By adjusting the twist angle, the at least one target implantation 140 may be performed very accurately at the desired implantation angle and twist angle. For example, the twist angle may be adjusted so that channeling conditions are obtained for the at least one target implantation 140.

The semiconductor substrate may be a silicon substrate or may be wide band gap semiconductor substrate having a band gap larger than the band gap of silicon (1.1 eV). For example, the semiconductor substrate may be a silicon carbide (SiC)-based semiconductor substrate, or gallium arsenide (GaAs)-based semiconductor substrate, or a gallium nitride (GaN)-based semiconductor substrate. The semiconductor substrate may be a semiconductor wafer or a semiconductor die.

The test implantation 110 and the at least one target implantation 140 may be performed from a front side of the semiconductor substrate or a back side of the semiconductor substrate. A front surface of the semiconductor substrate may be a surface of the semiconductor substrate used for forming metal layers, insulation layers and/or passivation layers of semiconductor devices to be manufactured. For example, a semiconductor substrate front side may be the side at which active elements (e.g. transistor structures) of the semiconductor device are formed. For example, in a power semiconductor device, a front side of the semiconductor substrate may be a side of the chip at which the source/emitter regions and gates/base regions are formed, and a chip back side may be a side of the chip at which the drain/collector region is formed. For example, more complex structures may be located at the front side of the semiconductor substrate than at the back side of the semiconductor substrate.

The semiconductor substrate may be used for manufacturing a semiconductor device. A method for forming a semiconductor device may comprise the processes of the method 100 for implanting ions into a semiconductor substrate and additional processes for forming the semiconductor device (e.g. forming gates of transistor structures, one or more metal layers on top of the semiconductor substrate, insulation layers and/or a passivation layer). For example, the doping of a portion of a compensation region of a superjunction device, a body region of a transistor, a field stop region, a back side emitter region, a junction termination extension structure, a channel stopper region, a buried back side doping region, a drift region and/or a field stop/emitter-shorting region may be implanted by the at least one target implantation 140.

For example, the semiconductor device to be manufactured may be a central processing unit, a microprocessor, a memory device, a digital signal processor or a power semiconductor device. A power semiconductor device or an electrical structure (e.g. transistor structure or diode structure) of the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

Different implantation angle ranges for the test implantation 110 and the at least one target implantation may be obtained in various ways. For example, an ion beam divergence during the test implantation 110 may be larger than an ion beam divergence during the at least one target implantation 140. Different ion beam divergences may be obtained by using different ion implantation modules for the test implantation 110 and the at least one target implantation 140 or by using different settings for beam divergence correction measures of an ion implantation module for the test implantation 110 and the at least one target implantation 140, for example. For example, the whole surface or a large portion of the surface of the semiconductor substrate may be irradiated by the ion beam simultaneously during the test implantation 110 without movement of the semiconductor substrate.

FIGS. 2a and 2b show an example of implantations with different ion beam divergences. The different ion beam divergences may be obtained by reducing the beam divergence correction measures during the test implantation 110 with respect to the at least one target implantation 140. FIGS. 2a and 2b show an implantation system using the same ion implantation module for the test implantation 110 and the at least one target implantation 140. The ion implantation module comprises an ion source, a deflection unit 210 and an angle correction unit 220 for generating an ion beam to implant ions into a semiconductor substrate 230. FIG. 2a shows a test implantation with deliberately set angle variation over the wafer. For example, the angle correction unit 220 is turned off or the effect is reduced in comparison to the setting during the target implantation 140. FIG. 2b shows a main implantation (target implantation) with parallel beam to ensure full-surface channeling conditions, for example. For example, the angle correction unit 220 is turned on or the effect is increased in comparison to the setting during the test implantation 110.

After the test implantation 110 as shown in FIG. 2a, a lateral crystal defect or charge carrier density distribution may be determined. FIG. 3 shows an example of a lateral crystal defect density distribution over a silicon wafer. The crystal defect or charge carrier density in proximity to the surface is lower at positions at which channeling conditions occurred during the test implantation. Therefore, FIG. 3 shows two orthogonal regions 310 of reduced crystal defect density or charge carrier density located at positions at which channeling along a planar {011} channel occurred. A minimum 320 of the crystal defect or charge carrier density is indicated at the crossing of the two orthogonal regions 310. The minimum 320 of the crystal defect or charge carrier density results from channeling conditions along a <100> channel during the test implantation 110. Further, FIG. 3 shows an expected position 330 at which the channeling conditions along a <100> channel was expected without the information obtained by the crystal defect or charge carrier density distribution. For example, the distance between the expected position 330 and the position of the minimum 320 of the crystal defect or charge carrier density is proportional to the implantation angle offset. Additionally, a rotation of the semiconductor substrate may be adjusted. For example, a rotation offset may be determined or calculated based on a direction of an offset vector (e.g. vector from minimum 320 of the crystal defect or charge carrier density to expected position 330) with respect to a coordinate system.

FIG. 3 may show an example of a measurement of the lateral crystal defect or charge carrier density distribution by a photo thermal measuring system. For example, the measurement is performed after a test implantation to determine the entire off orientation of a 100-crystal direction in relation to an orthogonally incident ion beam.

Alternatively or additionally to the usage of different ion beam divergences for the test implantation 110 and the at least one target implantation 140, a tilt angle of the semiconductor substrate may be varied while moving the semiconductor substrate through an ion beam. For example, the test implantation 110 may be performed by moving the semiconductor substrate through an ion beam of the test implantation 110 while a tilt angle of the semiconductor substrate is varied. For example, the semiconductor substrate is moved with a substantially constant speed through the ion beam along a first lateral direction. For example, the tilt angle is varied based on a function of the scan position (e.g. spot or strip of the beam on the wafer). While the ion beam wanders from one edge of the semiconductor substrate to an opposite edge of the semiconductor substrate, the tilt of the semiconductor substrate with respect to a beam direction is varied (e.g. continuously from a starting tilt angle to an end tilt angle), for example. FIG. 3 shows an example of a variation of a tilt angle (e.g. X-axis tilt) between −3° and +3° while varying the scan position (by moving the semiconductor substrate) at least between a position at which the ion beam hits a first wafer edge 410 (e.g. lower wafer edge) and a position at which the ion beam hits an opposite second wafer edge 420 (e.g. upper wafer edge). Then the semiconductor substrate is rotated by 90° and moved along the same first lateral direction through the ion beam while the tilt angle is varied. By scanning over the semiconductor substrate in two orthogonal directions while varying the tilt angle of the semiconductor substrate, a variation of the crystal defect or charge carrier density over the semiconductor substrate similar to the distribution shown in FIG. 3 may be obtained so that an implantation angle offset can be determined from the offset of a crossing point 320 of the two orthogonal regions 310 with respect to an expected region 330 resulting from a crossing point of the two orthogonal regions 310 which would be expected without the information about the crystal defect density or charge carrier density distribution.

Figure 4:
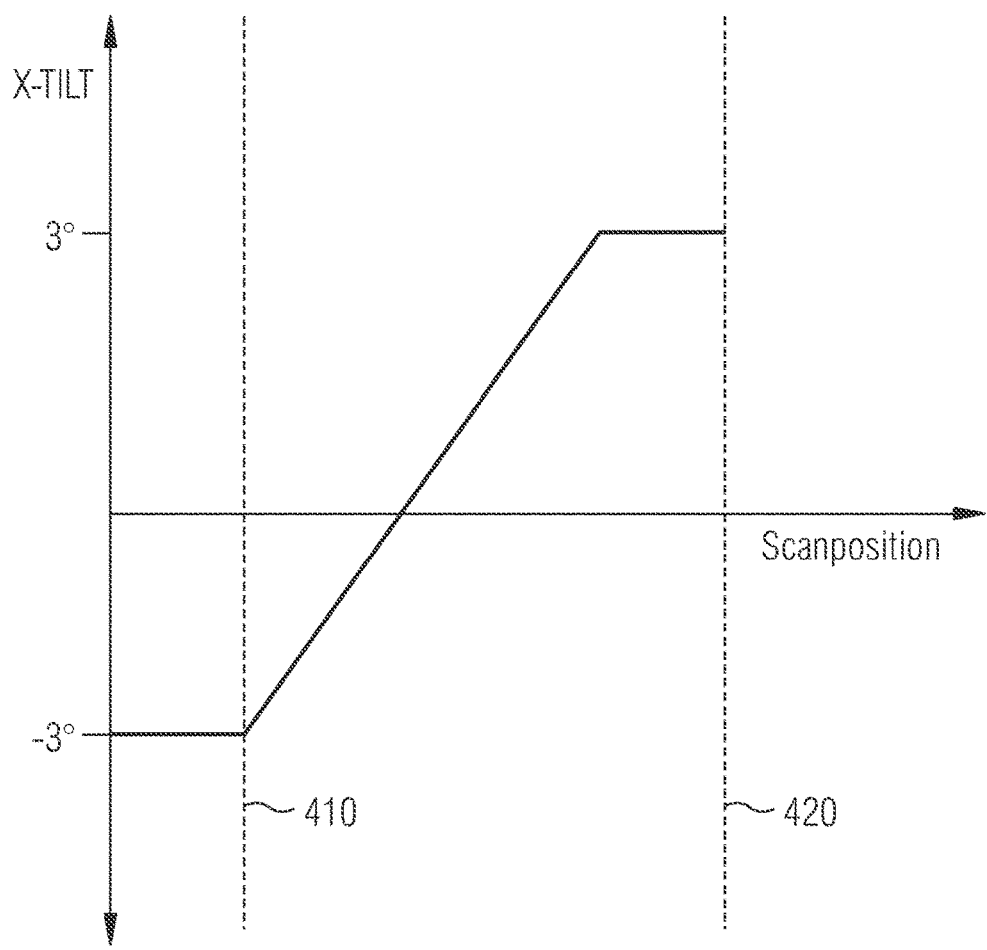
FIG. 4 shows a variation of a tilt angle of a semiconductor substrate while moving through an ion beam.

The concept shown in FIG. 4 may be used for systems with angle correction (without deactivation or adaptation possibility), which adjusts the beam parallelism magnetically and/or electro-static (or if a scan of a large angle range is desired), for example. For example, the Y-tilt (with respect to a rotation axis) is adjusted to an angle between 3° and 7° (at 0° twist and 0° X-tilt) to avoid the insensitive region at 0°/0°. Then, a vertical (Y) scan with half of the test dose may be performed while the X-tilt is a function of the scan position (e.g. FIG. 4) during a first implant step thus yielding a V-shaped distribution of crystal defect or charge carriers along one lateral direction of the wafer resulting from crossing a {011} planar channel during the scan. Afterwards, a second implantation step is performed with the same adjustment as for the first implant step, but with a +90° twist thus yielding a V-shaped distribution of crystal defect or charge carriers along another orthogonal lateral direction of the wafer resulting from crossing a {011} planar channel during the scan. Then, a measurement of a cross-shaped map (within the tool/in situ or as an independent process step) may be performed and a feed-forward loop to the implanter and/or another tool in the process chain (channeling yield (axial: 100, planar {001}) as a function of the orientation X/Y) may be implemented. For example, the orientation of the substrate is known very accurately now considering a very low orienter inaccuracy of the substrate with respect to rotation (e.g. position of the <011> notch/flat). Consequently, an arbitrary desired direction or channel can be adjusted in a following process, for example.

Figure 5A:
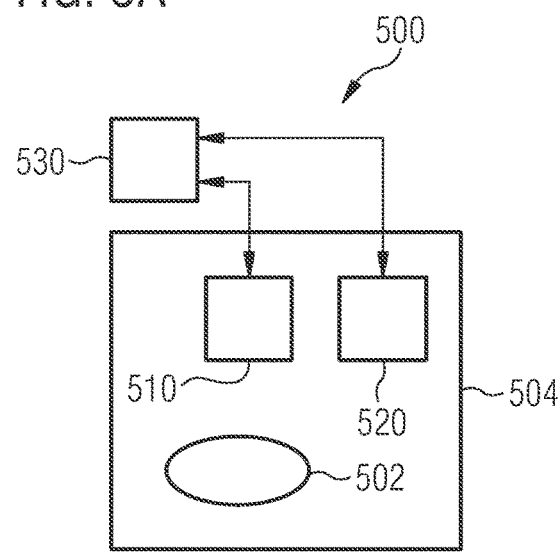
FIG. 5a shows a schematic illustration of an implantation system.

FIG. 5a shows a schematic illustration of an implantation system according to an embodiment. The implantation system 500 comprises a first ion implantation module 510 configured to perform a test implantation of ions into a semiconductor substrate 502 and a measurement module 520 configured to determine channeling information indicating a position at the semiconductor substrate 502 at which channeling conditions occurred during the test implantation. Further, the implantation system 500 comprises a processing module 530 configured to determine an implantation angle offset based on the channeling information. The first or a second ion implantation module 510 is configured to adjust a tilt angle of the semiconductor substrate 502 with respect to an implantation direction based on the determined implantation angle offset. Further, the first or second ion implantation module 510 is configured to perform at least one target implantation of ions into the semiconductor substrate 502 after the adjustment of the tilt angle.

By performing a test implantation and adjusting the tilt angle of the semiconductor substrate, the angle accuracy for the target implantation may be significantly improved. In this way, the reproducibility and/or accuracy and/or reliability of implantation may be improved.

The same (first) ion implantation module 510 may be used for the test implantation and the at least one target implantation. For example, the implantation module may be operated to ensure channeling conditions over the whole surface or a large portion of the surface (e.g. by beam parallelization). Further, the at least one ion implantation module 510 and the measurement module 520 may be arranged in a common implantation chamber 504 so that the semiconductor substrate can stay within the common implantation chamber 504 during the test implantation, the determination of the channeling information and the target implantation. Alternatively, the ion implantation module 510 and the measurement module 520 are implemented in different apparatuses and the semiconductor substrate is moved between the different apparatuses.

The measurement module 520 may be a crystal defect or charge carrier measurement module configured to measure a crystal defect or charge carrier density of at least a plurality of laterally different positions of the semiconductor substrate after the test implantation to obtain a lateral crystal defect or charge carrier density distribution. For example, the crystal defect or charge carrier measurement module may comprise a photo thermal measuring system. Alternatively, the measurement module 520 may be a Rutherford Backscattering Spectrometry (RBS) detection module. For example, the Rutherford Backscattering Spectrometry (RBS) detection module may determine a crystal defect density distribution based on a signal feedback from the semiconductor substrate during a test implantation. Utilizing information on a scan position and/or angle (e.g. provided by a tilt encoder or an electrostatic scanner unit) the Rutherford Backscattering Spectrometry (RBS) detection module or the processing module 530 may calculate a map similar to the distribution shown in FIG. 3. The scan position may relate to a movement of the wafer with respect to a chamber or a stationary beam and/or an information of a current position, for example, of a spot-shaped beam at the wafer (e.g. generated based on a signal of a scanner power supply). Tilt and/or twist may be seen as mechanical (wafer) or as virtual on the basis of a sweep of the beam over the wafer (e.g. may be calculated based on signals form the scanner). For example, the processing module 530 may calculate a crystal defect density distribution based on a correlation between a Rutherford Backscattering Spectrometry signal generated by the Rutherford Backscattering Spectrometry detection module and information on an actual (or current) scan position and/or scan angle.

The processing module 530 may comprise a processor, a microcontroller or a digital signal processor for determining the implantation angle offset, for example.

Alternatively, the test implantation and the at least one target implantation may be performed by different (first and second) ion implantation modules. For example, different ion implantation modules are located at fixed positions and a difference between an implantation direction of the first ion implantation module used for the test implantation and an implantation direction of the second ion implantation module used for the at least one target implantation is known and can be considered during the adjustment of the tilt angle before the at least one target implantation.

Figure 5B:
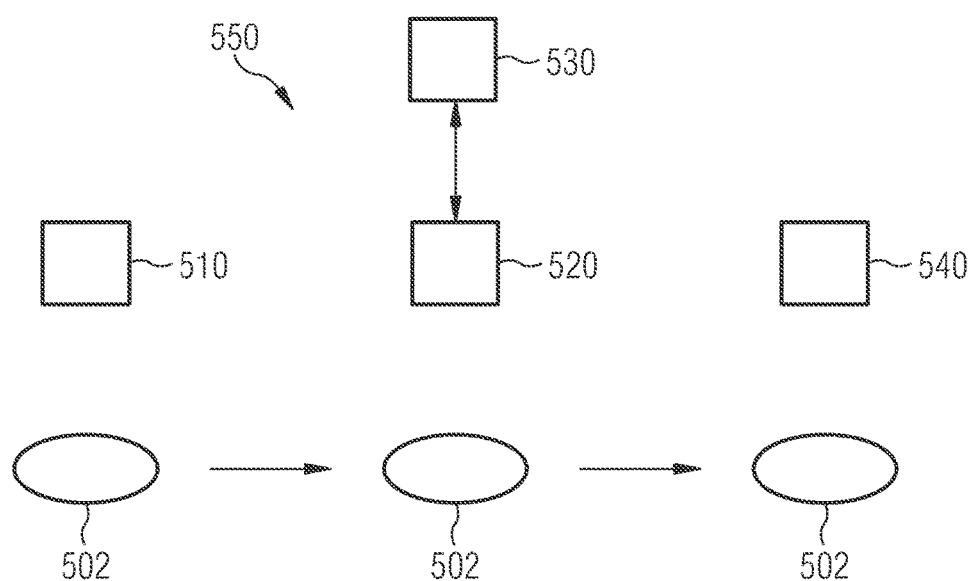
FIG. 5b shows a schematic illustration of another implantation system.

FIG. 5b shows a schematic illustration of an implantation system according to an embodiment. The implementation of the implantation system 550 is similar to the implementation shown in FIG. 5a. However, two different ion implantation modules 510, 540 are used for the test implantation and the at least one target implantation. After the test implantation, the semiconductor substrate is moved from the first ion implantation module 510 to the measurement module 520. After the determination of the channeling information, the semiconductor wafer is moved to the second ion implantation module 540 and the tilt angle is adjusted.

More details and aspects are mentioned in connection with the embodiments described above or below. The embodiments shown in FIGS. 5a and 5b may comprise one or more optional additional features corresponding to one or more aspects mentioned in connection with the proposed concept or one or more embodiments described above (e.g. FIG. 1-4) or below (FIG. 6).

Figure 6:
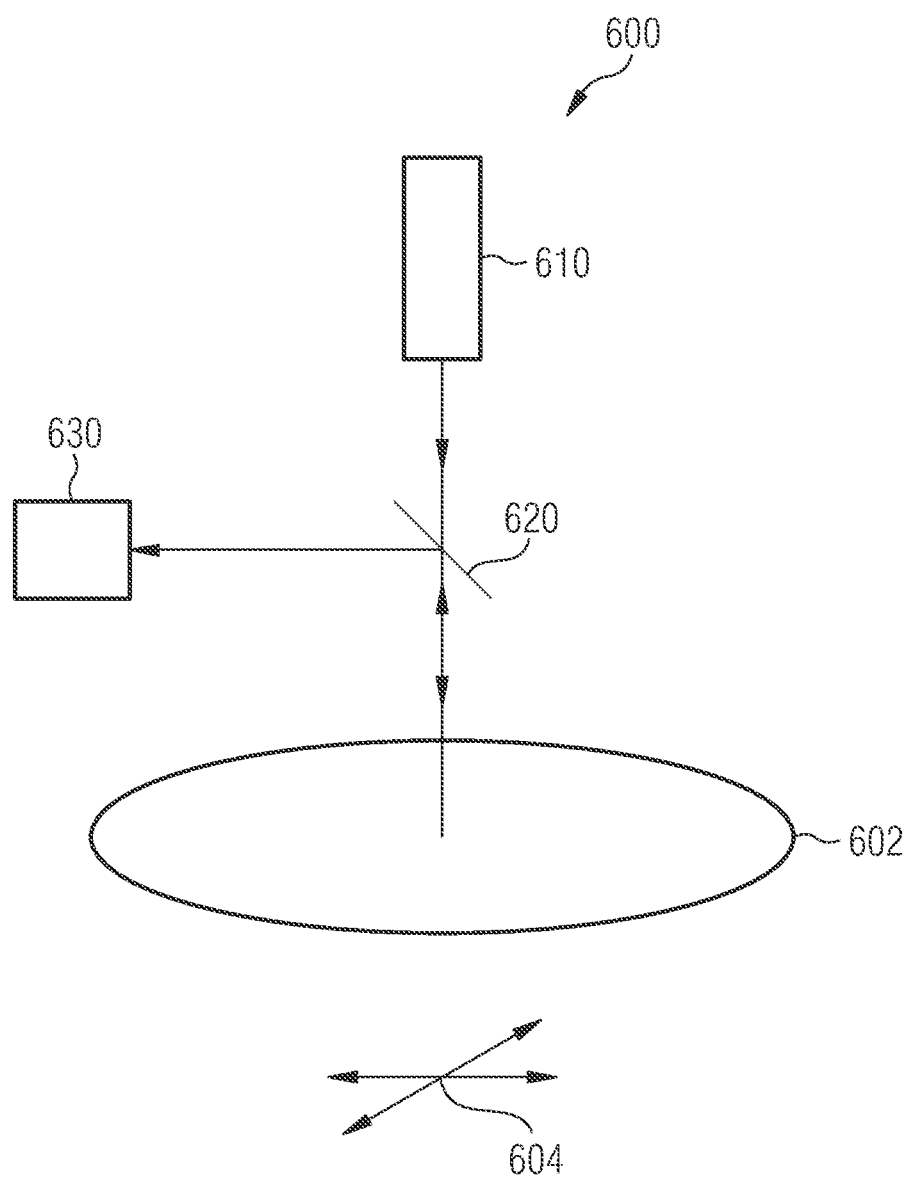
FIG. 6 shows a schematic illustration of a photo thermal measuring system.
Figure 7:
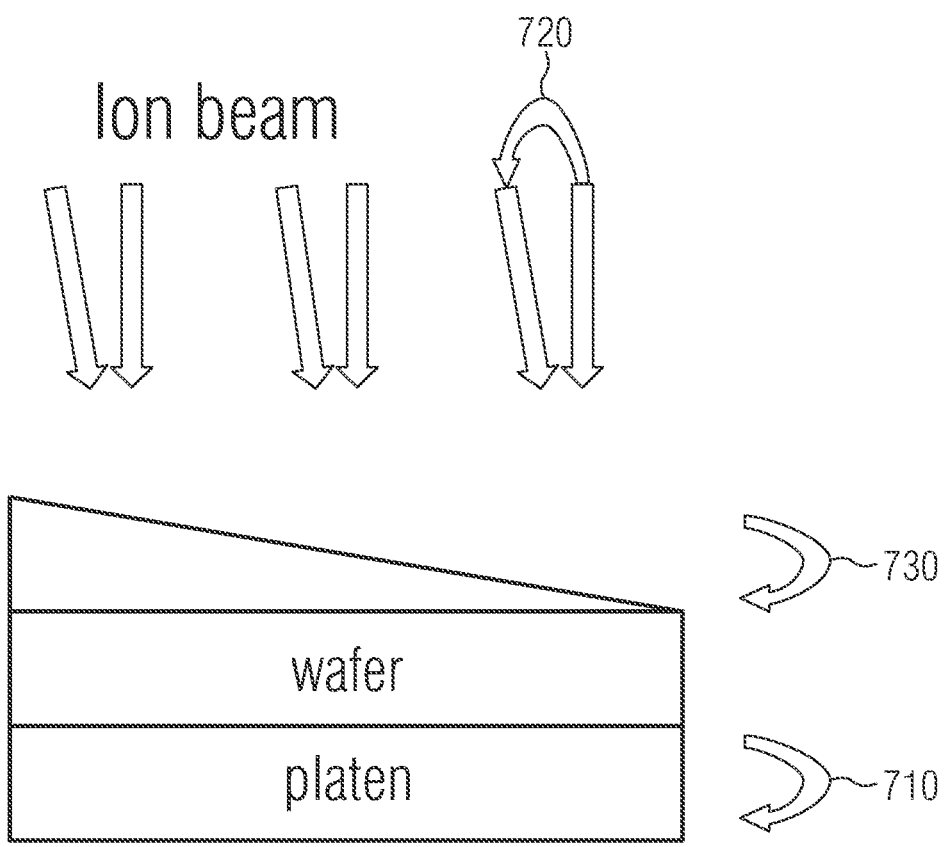
FIG. 7 shows a schematic illustration of influencing variables on the channeling effect.

FIG. 6 shows a schematic illustration of a photo thermal measuring system for measuring a lateral crystal defect or charge carrier density distribution at a semiconductor substrate. The photo thermal measuring system 600 comprises a laser module (e.g. one or more laser diodes), a beam splitter 620, a detector 630 and a moveable stage 604 (e.g. x-y stage) for moving a semiconductor substrate 602. For example, a reflection coefficient varies for different crystal defect densities and/or charge carrier densities. The described measurement system may be small enough to be integrated in an implantation apparatus, for example.

Some embodiments relate to a method for verifying channeling conditions by applying a test implantation. According to an aspect, a direct measurement of the crystal damage of the process wafer after implantation of a test implant at the production system is performed. For the test implant, the parallelization (both in x and y direction) of the ion beam may be deactivated before the wafer so that the wafer may be hereby only impacted in the middle under 0° channeling conditions (see FIG. 2a). For example, depending on the system geometry (distance between wafer and electrostatic or magnetic deflector) and the wafer size, the edge of the wafer is impacted at an angle ψ greater 0°, e.g., 1.8°. The (known) dependency of the angle on the position at the wafer ψ (x,y) may result in a stereographical projection of the crystal lattice on the wafer. This projection may be visualized using a measurement method sensitive to crystal damage. Using the feedback of a laser beam, e.g., a map of the crystal damage (e.g. FIG. 3) may be recorded (e.g. metrology tool). For example, if the crystal damage measured at a 100-oriented wafer is minimal in the center of the wafer, channeling is ensured. If an offset exists from the center of the wafer, the orientation may automatically be readjusted on a wafer-fine basis (e.g., using a feed-forward mechanism or, as an alternative, directly in the system). A corresponding stereographical projection which was generated by a proton implantation without angle correction under a 0° main direction (angle between ion beam and wafer normal in the center of the wafer) is illustrated in FIG. 3. If the system geometry is known, based on the deviation of the [100]-channel from the center of the wafer (shifting Δx, Δy), the angle ψ(Δx, Δy) and rotation (dx, dy) may be determined by which the wafer needs to be tilted during implantation to ensure that the ion beam impacts on the wafer (0° tilt) in a orthogonal way. By reactivating the parallelization of the ion beam and setting the angle ψ(Δx, Δy) and rotation during a subsequent main implantation step, full-surface channeling may be ensured (e.g. FIG. 2b).

The test implant may be selected such that it has no negative impact on the device. This may be done either via an angle-insensitive implantation step which may be required anyway or, for example, by using a low-dose proton implantation, low-dose boron implantation or low-dose phosphorous implantation (e.g., the range around $3*10^{12}$ cm$^{-2}$). The sensitivity of the crystal damage measurement may be here at an optimum level and the small effect of the proton implantation may completely disappear again in the subsequent high-temperature steps (>550° C.).

For example, an aspect of the proposed concept relates to a method to determine, prior to angle-sensitive implantations, the accurate crystal orientation of the wafer using a low-dose test implant and subsequent crystal damage measurement, and to be able to optimally perform the actual implantation step in a correspondingly adjusted manner.

For example, as a result of the small dimensions of the semiconductor laser required and the detectors, the measurement of the crystal damage may directly be integrated into the implantation tool. An example of the set-up of such a measurement is shown in FIG. 6. Here, the measurement may be carried out in various ways in the implanter.

For example, the measurement system (laser+detector) is incorporated into the end station of the implanter, at which the system is attached, shifted in lateral direction to the wafer, in order not to shade the incident ion beam. The measurement system may be movable in x-y direction and/or very finely tiltable in order to achieve a sufficient lateral resolution at the wafer. In other words, the measurement unit may be mounted on an arm movable in x-y direction within the end station. After the test implant, the ion beam may be faded out by inserting a Faraday Cup, and the measurement may be carried out directly at the implantation chuck by fine movement of the measuring device.

Alternatively, the measurement unit may be attached directly on top of an interim storage space (e.g. orienter chuck) which may be part of the handling system of the implanter. Thus, the measurement may be carried out as part of the handling of the wafer in parallel to/by the implantation chuck.

Some examples of application relate to compensation columns of superjunction devices, the generation of body zones having a plateau-like doping profile to suppress latch-up phenomena in IGBTs (insulated gate bipolar transistor) and power MOSFETs (metal oxide semiconductor field effect transistor) and to reduce the diffusion current portion of the (hot) blocking current, deep, n-doped field stop zones for IGBTs, diodes or MOSFETs, stepped field stop profiles by locally depositing thin scattering oxide, stepped backside emitters by locally depositing thin scattering oxide, relatively deep, back-side n-emitters for diodes or back-side p-emitters for IGBTs, deep Junction Termination Extension structures or Variation of lateral doping structures, deep channel stoppers to avoid inversion channels, buried back-side p-islands for diodes to improve the softness during the switch-off process, generation of relatively highly doped drift zones in SiC devices and/or (Stepped) field stop/emitter/n-shorts profiles without subsequent annealing. With regard to IGBTs, another application may be an approximately box-type p-body doping profile to reduce latch-up effects.

For example, in modern implanters, the plant engineering-related influencing variables concerning angular accuracy (platen adjustment, ion beam divergence) are already specified to <0.1° and may be small enough to ensure channeling.

Thus, the remaining outstanding issues may be the wafer cut (particularly in case of technologies which are based on epitaxial layers) and the 0° verification, which is important with regard to quality engineering, of the sum of all possible influencing variables directly prior to the channeling implantation. An accurate 0° verification may be enabled by using the proposed concept.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for implanting ions into a semiconductor substrate, the method comprising:
    performing a test implantation of ions into the semiconductor substrate, wherein the ions of the test implantation are implanted with a first implantation angle range over the semiconductor substrate;
    determining an implantation angle offset based on the semiconductor substrate after the test implantation;
    adjusting a tilt angle of the semiconductor substrate with respect to an implantation direction based on the determined implantation angle offset; and
    performing at least one target implantation of ions into the semiconductor substrate after the adjustment of the tilt angle, wherein the ions of the at least one target implantation are implanted with a second implantation angle range over the semiconductor substrate, wherein the first implantation angle range is larger than the second implantation angle range.

2. The method according to claim 1, wherein the first implantation angle range is larger than 0.8°.

3. The method according to claim 1, wherein the second implantation angle range is lower than 0.5°.

4. The method according to claim 1, wherein performing the test implantation comprises moving the semiconductor substrate through an ion beam of the test implantation while a tilt angle of the semiconductor substrate is varied.

5. The method according to claim 1, wherein an ion beam divergence during the test implantation is larger than an ion beam divergence during the at least one target implantation.

6. The method according to claim 5, wherein beam divergence correction measures are reduced during the test implantation with respect to the at least one target implantation.

7. The method according to claim 1, wherein determining the implantation angle offset comprises measuring a crystal defect density or charge carrier density of at least a plurality of laterally different positions at the semiconductor substrate to obtain a lateral crystal defect density distribution or a lateral charge carrier density distribution.

8. The method according to claim 7, wherein the crystal defect density or charge carrier density distribution is measured by a laser-based measurement method or a Rutherford Backscattering Spectrometry method.

9. The method according to claim 1, wherein determining the implantation angle offset comprises determining a position at the semiconductor substrate at which channeling conditions occurred during the test implantation.

10. The method according to claim 1, wherein the tilt angle is adjusted so that channeling conditions are obtained for the at least one target implantation.

11. The method according to claim 1, wherein the test implantation and the at least one target implantation are performed by the same ion implantation module.

12. The method according to claim 1, wherein the test implantation is performed at an implantation energy of less than 50 keV.

13. The method according to claim 1, wherein the test implantation is performed at an implantation dose of less than 3×1012 cm−2.

14. The method according to claim 1, wherein the ions of the test implantation are protons.

15. The method according to claim 1, wherein the doping of at least one of the group comprising a portion of a compensation region of a superjunction device, a body region of a transistor, a field stop region, a back side emitter region, a junction termination extension structure, a channel stopper region, a buried back side doping region, a drift region and a field stop/emitter-shorting region is implanted by the at least one target implantation.

16. The method according to claim 1, further comprising determining a twist angle of the semiconductor substrate based on the semiconductor substrate after the test implantation.

* * * * *